United States Patent [19]

Holden

[11] Patent Number: 4,508,161

[45] Date of Patent: Apr. 2, 1985

[54] METHOD FOR GAS-ASSISTED, SOLID-TO-SOLID THERMAL TRANSFER WITH A SEMICONDUCTOR WAFER

[75] Inventor: Scott C. Holden, Manchester, Mass.

[73] Assignee: Varian Associates, Inc., Palo Alto, Calif.

[21] Appl. No.: 585,819

[22] Filed: Mar. 2, 1984

Related U.S. Application Data

[62] Division of Ser. No. 381,669, May 25, 1982, Pat. No. 4,457,359.

[51] Int. Cl.³ .............................................. F28F 13/00
[52] U.S. Cl. ........................................ 165/1; 51/235; 51/324; 118/724; 118/728; 165/80 C; 165/185; 269/26
[58] Field of Search ................... 51/217 L, 235, 324; 118/724, 725, 726, 727, 728; 165/80 R, 80 A, 80 B, 80 C, 80 D, 185, 1; 269/26

[56] References Cited

U.S. PATENT DOCUMENTS

| | | | |
|---|---|---|---|
| 3,062,507 | 11/1962 | Andrus | 165/185 |
| 3,190,262 | 6/1965 | Bakish et al. | 118/724 |
| 3,566,960 | 8/1969 | Stuart | 204/298 X |
| 4,139,051 | 2/1979 | Jones et al. | 165/1 |
| 4,261,762 | 4/1981 | King | 118/728 |
| 4,282,924 | 8/1981 | Faretra | 165/80 E |

OTHER PUBLICATIONS

King et al., "Experiments on Gas Cooling of Wafers," Nucl. Instrum. Methods, 189 (1981), pp. 169–173.
Hammer, "Cooling Ion Implantation Target," IBM Technical Disclosure Bulletin, vol. 19, No. 6, Nov. 1976, pp. 2270–2271.

Primary Examiner—Sheldon J. Richter
Attorney, Agent, or Firm—Stanley Z. Cole; William R. McClellan

[57] ABSTRACT

Apparatus and method are provided for effecting gas-assisted, solid-to-solid thermal transfer with a semiconductor wafer. A semiconductor wafer is loaded at its periphery onto a shaped platen. Sufficient contact pressure from the loading is produced between the wafer and the platen so that significant gas pressure may be accommodated against the back side of the wafer without having the wafer bow outwardly or break. Gas under pressure is introduced into the microscopic void region between the platen and the wafer. The gas fills the microscopic voids between the platen and semiconductor wafer. The gas pressure approaches that of the preloading contact pressure without any appreciable increase in the wafer-to-platen spacing. Since the gas pressure is significantly increased without any increase in the wafer-to-platen gap, the thermal resistance is reduced and solid-to-solid thermal transfer with gas assistance produces optimum results.

9 Claims, 11 Drawing Figures

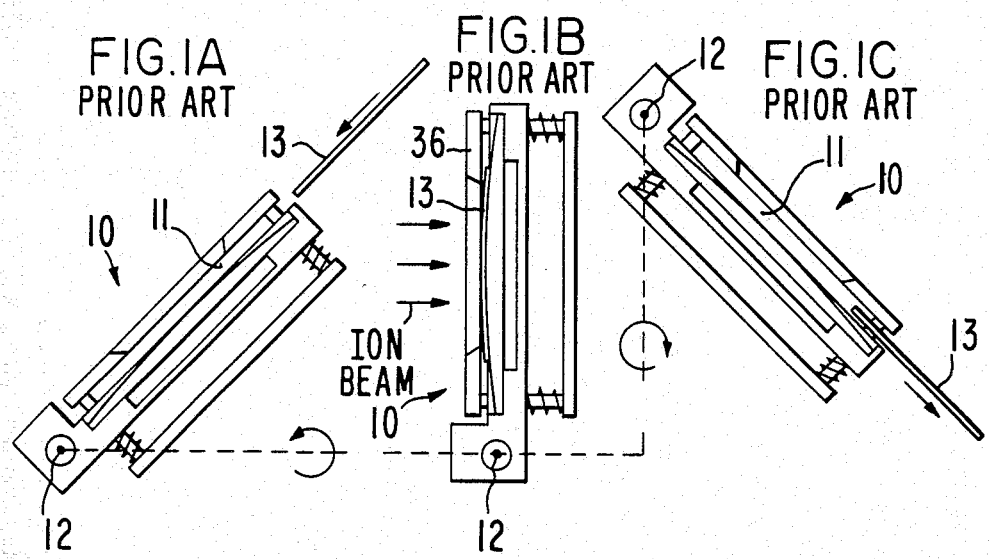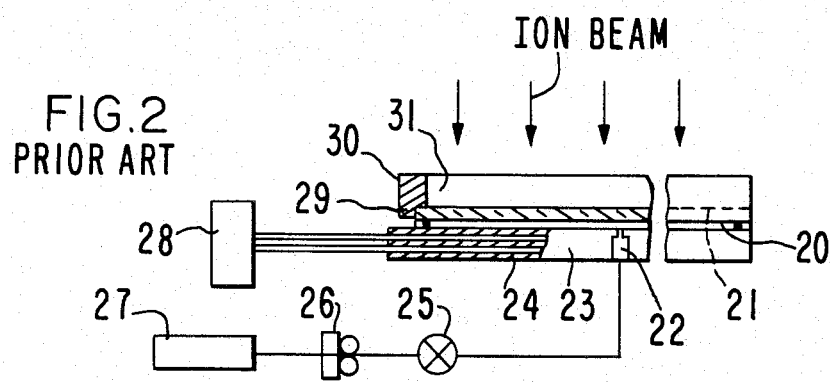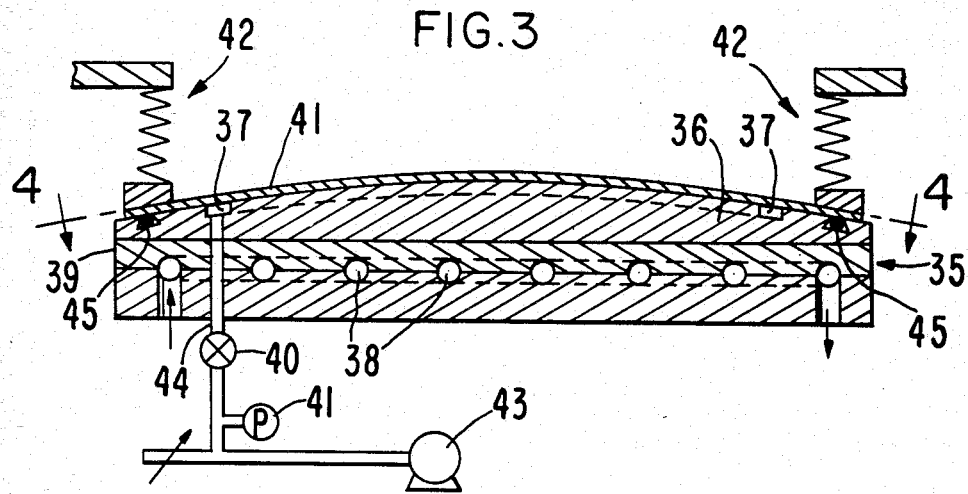

METHOD FOR GAS-ASSISTED, SOLID-TO-SOLID THERMAL TRANSFER WITH A SEMICONDUCTOR WAFER

This is a division of application Ser. No. 381,669, filed May 25, 1982, now U.S. Pat. No. 4,457,359.

DESCRIPTION

This invention relates to apparatus for effecting thermal transfer with a semiconductor wafer and, more particularly, relates to apparatus for effecting solid-to-solid thermal transfer with a semiconductor wafer which introduces a gas into microscopic voids between the wafer and an underlying platen to assist in thermal conduction.

In the processing of semiconductor wafers, e.g., in order to fabricate integrated circuits, it sometimes occurs that wafers are subjected to elevated temperatures. For the diffusion of impurities, the growth of epitaxial layers, the application of high quality metal films or annealing of metal semiconductor contacts, and the like, such elevated temperatures are desirable. In these situations, it is desirable to apply thermal energy in a controlled and uniform manner. For other applications, such as ion implantation and etching, thermal energy is an unwanted byproduct. In these latter applications, it may be undesirable to allow the wafers to remain at elevated temperatures since, for example, gratuitous diffusion beyond prescribed limits, as well as the segregation of impurities at epitaxial interfaces is not desired. Also, photoresist layers may be affected at these elevated temperatures. This problem is enhanced in the fabrication of large scale integration (LSI) and very large scale integration (VLSI) devices since a large number of processing steps must be used in sequence; in particular, near the end of the processing sequence there are large numbers of doped regions, conducting layers or insulating layers in place and it is not desirable to disturb these physical features by thermal treatment. In these situations, one wants to cool the semiconductor wafers in a controlled and uniform manner. Thus, it is desired to raise semiconductor wafers to elevated temperatures when a process step positively requires it and, on the contrary, to cool a semiconductor wafer to prevent elevated temperatures from being attained when unwanted heat is generated.

Previous approaches to effecting thermal transfer with a semiconductor wafer have involved radiation, convective and conductive means. Wafers have been heated by infrared radiation of the exposed upper surface and wafers have been allowed to cool off relatively. Wafers have been raised to elevated temperatures by streams of heated gas. And wafers have been heated inductively as they rest on susceptors. Also, wafers have been kept cool by scanning intermittently either or both the ion beam or the wafer (thereby limiting throughput), providing an actively cooled metal plate, coated with grease or oil, for the semiconductor wafer to rest upon, or applying an electrostatic force to hold a wafer against a slightly compressible surface on an actively cooled plate. See, e.g., L. D. Bollinger, "Ion Milling for Semiconductor Production Processes", Solid State Technology, Nov. 1977. These prior art techniques and devices have proven to not be wholly effective at cooling semiconductor wafers when high ion fluxes or energy levels are experienced. A convexly curved platen to which a semiconductor wafer is clamped is disclosed in R. A. Faretra, U.S. Pat. No. 4,282,924, "Apparatus for Mechanically Clamping Semiconductor Wafer Against Pliable Thermally Conductive Surface". The cooling efficiency of this apparatus is limited by the extent to which the backside of the wafer actually contacts the thermally conductive surface since, at the microscopic level, only small areas of the two surfaces (typically less than 5%) actually come in contact.

The technique of gas conduction is known to permit thermal coupling between two opposed surfaces. The technique has been widely employed. For example, in O. E. Andrus, "Multi-Layer Vessel Having a Heat Transfer Material Disposed Between Layers", U.S. Pat. No. 3,062,507, a gas (or liquid) is placed between layers of a vessel to obtain optimum heat transfer. Gas conduction heat transfer to produce switching in cryogenic pumps is disclosed, for example, in B. S. Denhoy, U.S. Pat. No. 3,525,229, "On-Off Thermal Switch for a Cryopump"; T. P. Hosmer, U.S. Pat. No. 3,717,201, "Cryogenic Thermal Switch"; R. W. Stuart, et al., "Thermal Switch for Cryogenic Apparatus", U.S. Pat. No. 3,430,455; and W. H. Higa, U.S. Pat. No. 3,421,331, "Refrigeration Apparatus". In each case, thermal transfer between opposed surfaces is obtained by gas conduction.

In R. V. Stuart, "Cooling Apparatus for Vacuum Chamber", U.S. Pat. No. 3,566,960, the problem of inadequate contact between solid surfaces is discussed (see column 3, line 2 et. seq.) and a circulating gaseous or liquid medium to cool the workpiece in the vacuum chamber is disclosed. In the same vein, gas conduction cooling of a workpiece, preferably a semiconductor wafer, in a vacuum is shown in M. King and P. H. Rose, "Experiments on Gas Cooling of Wafers", Proceedings, Third International Conference on Ion Implantation Equipment and Techniques, Queens University, Kingston, Ontario (May, 1980), and in M. King, U.S. Pat. No. 4,264,762, "Method of Conducting Heat to or From an Article Being Treated Under Vacuum". In this apparatus, gas is introduced into the middle of a cavity behind a semiconductor wafer. Thermal coupling between a support plate and the wafer is achieved through a gas as typically accomplished in the gas conduction art. In practice, however, there is a finite leakage rate due to imperfect seals so that a pressure gradient exists between the middle of the cavity and the periphery. Since the heat conductivity in a gas is proportional to pressure, more heat is transferred at the center where a higher pressure exists and a temperature gradient exists across the wafer. For certain processes, such as metal coating, this temperature gradient leads to non-uniform processing which may be undesirable. In addition, since the wafer is not pressed against a platen, it is free to move as a membrane whenever appreciable pressure is introduced into the gap between the support plate and the wafer. Outward movement of the wafer-membrane increases the gap so that thermal conduction is decreased, thereby yielding up any gain in conduction due to the increase in gas pressure.

It is therefore an object of the present invention to provide an apparatus and method for effecting gas-assisted, solid-to-solid thermal transfer with a semiconductor wafer.

It is a further object of the present invention to provide an apparatus and method which combines the benefits of solid contact thermal transfer with the benefits of thermal transfer by gas conduction.

It is another object of the present invention to provide an apparatus and method for effecting gas-assisted, solid-to-solid thermal transfer with a semiconductor wafer wherein the wafer is preloaded to a shaped platen to permit high gas pressures to be employed without bowing of the wafer and thereby optimizing the gas-assisted component of thermal transfer.

BRIEF DESCRIPTION OF THE DRAWINGS

For a complete understanding of the apparatus of the present invention reference may be had to the accompanying figures which are incorporated herein by reference and in which:

FIGS. 1A–1C are illustrations of apparatus of the prior art for solid contact thermal transfer with semiconductor wafers;

FIG. 2 is an illustration of apparatus of the prior art for gas conduction cooling;

FIG. 3 is a cross sectional view of apparatus of the present invention;

SUMMARY OF THE INVENTION

Apparatus and method are provided for effecting gas-assisted, solid-to-solid thermal transfer with a semiconductor wafer. A semiconductor wafer is loaded at its periphery onto a shaped platen. Sufficient contact pressure from the loading is produced across the wafer so that gas pressure up to the magnitude of the initial loading may be applied against the back side of the wafer without having the wafer lift off the platen. Gas under significant pressure is introduced into the microscopic voids between the wafer and the platen while the gap remains nearly constant. Since the gap remains narrow, even at high pressures up to the preloading level, thermal resistance is reduced and thermal transfer is enhanced.

DESCRIPTION OF THE PREFERRED EMBODIMENT

The conduction of heat from one solid to another is a fundamental thermal transfer phenomenon. The terminology employed depends upon convention, but such conduction includes transfer in either direction, i.e., includes both heating and cooling. See, e.g., H. Grober, et. al., *Fundamentals of Heat Transfer*, Part I, "Conduction of Heat in Solids" (1961). Ideally, the two surfaces of the respective solids which make contact are in complete contact over all their area. In practicable systems, however, such as a semiconductor wafer pressed against the surface of a platen, there are irregularities in the two surfaces on a microscopic scale. As a consequence, in the field of semiconductor production equipment even though a semiconductor wafer is firmly pressed against a platen, the actual area in contact on a microscopic scale is substantially less than ten percent (10%) of the total surface area. This renders solid-to-solid heat transfer less than optimum, especially for semiconductor wafers which are typically processed under vacuum conditions where convective or conductive contributions to transfer do not occur. The factors which determine the effectiveness of solid-to-solid thermal transfer in a vacuum are described in M. G. Cooper, et. al., "Thermal Contact Conductance", Int. J. Heat Mass Transfer, v. 12, p. 279 (1969).

Figure 6:
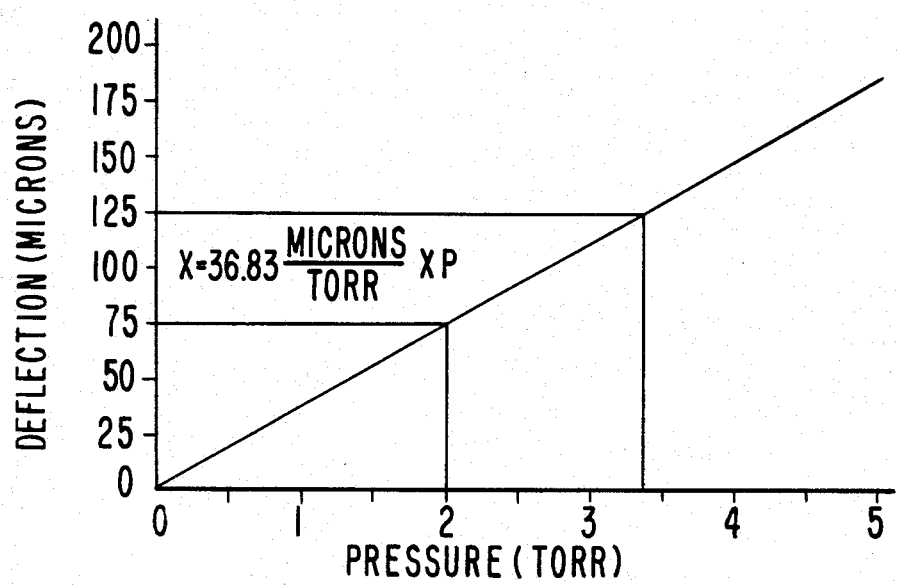
FIG. 6 is a curve showing centerpoint deflection for a silicon wafer as a function of gas pressure.

The technique of gas conduction as applied to semiconductor wafers is exemplified by the apparatus and process of M. King and P. H. Rose, "Experiments on Gas Cooling of Wafers", Proceedings, Third Interactional Conference on Ion Implantation Equipment and Techniques, Queens University, Kingston, Ontario (May 1980), and in M. King, "Method of Conducting Heat to or From an Article Being Treated Under Vacuum", U.S. Pat. No. 4,264,762. A semiconductor wafer is placed above a support plate with a gap inbetween into which is introduced a gas. Heat is conducted through the gas between the wafer and the support plate. The pressure of the gas is necessarily below that which would eject the wafer from the support plate, thereby defeating the underlying purpose of thermal transfer. Even if the water is firmly clamped to the support plate the maximum gas pressure allowed is that pressure at which the wafer, as a thin membrane, would begin to deform substantially away from the support plate. As shown in FIG. 6, this deformation in a 100 mm wafer becomes considerable at pressure of 1 Torr. Such deformation would therefore be intolerable as thermal transfer would be severely degraded as the gap between the support plate and wafer increased. This is seen by curve 'a' in FIG. 7 where thermal transfer is plotted as a function of pressure for the deformed wafer of FIG. 6. As the wafer starts to deform in the center thermal conductivity for the wafer is quickly degraded. Thus, the thermal transfer capability of a pure gas conduction technique is limited to that which can be attained at pressures below about 2 Torr.

Figure 4:
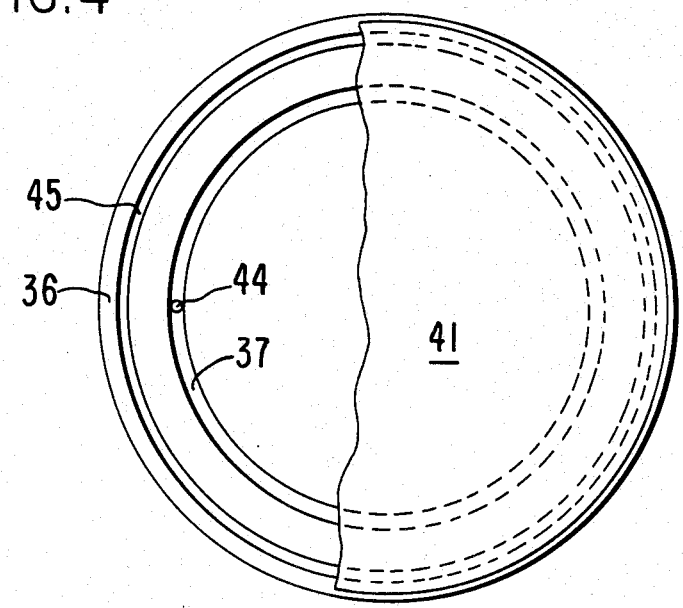
FIG. 4 is a plan view of the apparatus of FIG. 3.

In the embodiment of the apparatus of the present invention shown in cross-sectional view of FIG. 3 and in plan view in FIG. 4, gas is introduced through conduit 44 into annular indentation 37 which circumscribes the surface of shaped platen 36. Annular indentation 37 introduces gas around the periphery of the water adjacent the location where the wafer is clamped on the top side and sealed from below by item 45. The contact pressure between the surface of shaped platen 36 and the back of wafer 41 will be produced by the application of clamping force from means 42. This pressure is selected to be below that which would fracture wafer 41, yet is significant enough to permit accommodation of significant gas pressure behind the wafer. As gas is introduced under pressure from source 43, through valve 40 and channel 44 to annular channel 37, it fills the microscopic voids in the interface between the bottom of wafer 41 and the surface of platen 36. As gas is introduced a portion of the pressure which holds the wafer in its curved contour is now provided by the gas. As the pressure is increased, still more of the force applied to the wafer is contributed by the gas within the microscopic voids and less of the force is contributed by solid contact of the wafer with the surface of the platen. Even with increased gas pressure the water remains in place and until gas pressure equals the preload pressure. Then, the wafer ceases to be solidly supported by the wafer, and the wafer is lifted off the peaks of the solid surface. The wafer begins to act as a membrane which is subject to bowing by the applied gas. Basically, the gas pressure compensates for the force applied by means 42 and the wafer floats above the surface of the platen. Any increase in pressure above this level will be comparable to applying like increases to a wafer that is not preloaded. Thus, as shown by FIG. 6, under the application of even 1-2 Torr over pressure, the wafer will begin to deform and the thermal conductivity will severely degrade. This is indicated by portion 'c' of FIG. 8 where net thermal conduction by the apparatus of the present invention drops off rapidly when the pressure exceeds the preload contact pressure.

The ultimate determination of the thermal transfer capabilities of platen 35 is based on the thermal capacity of the heated or cooled fluid which circulates through channels 38. The thermal mass of platen 35 is sufficiently great so that platen 35 appears as a large heat source or sink to the wafer 41 (typically the wafer has a mass of about 4 grams).

Figure 8:
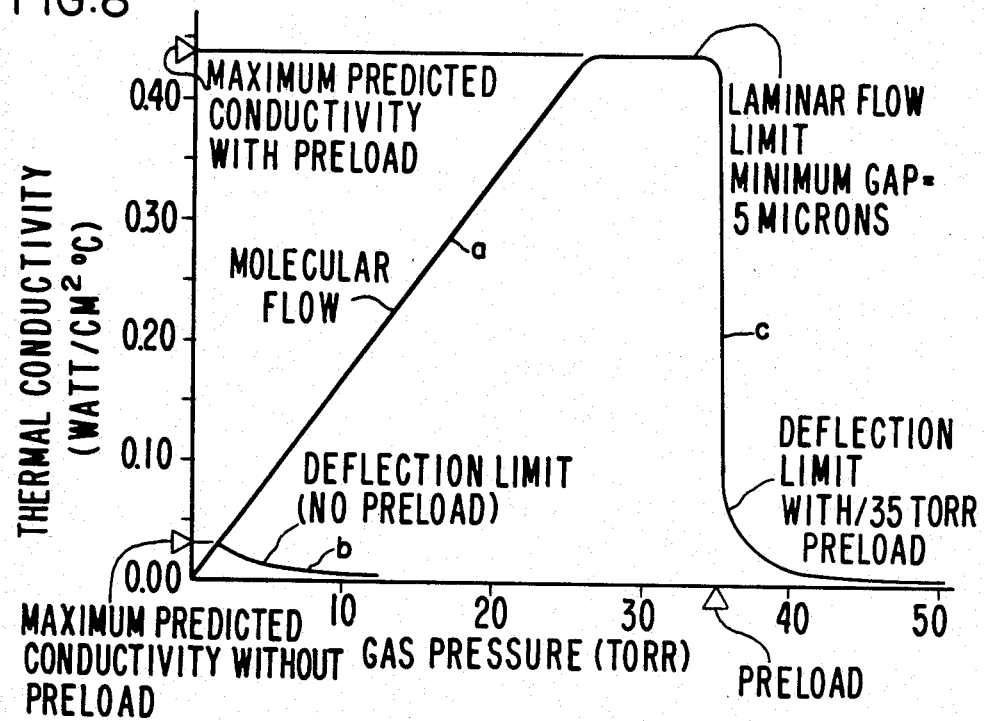
FIG. 8 is a curve showing thermal transfer with the apparatus of the present invention as a function of gas pressure.

The apparatus and method of the present invention combines the benefits of solid-to-solid thermal transfer with thermal transfer assistance from gas conduction. The assistance from gas conduction may be significant since very significant gas pressures may be attained. As shown in FIG. 8, for a preloading pressure of 35 Torr, the pressure behind the wafer may reach nearly 35 Torr without lifting of the wafer. The apparatus of the present invention produces solid-to-solid contact between the semiconductor wafer and a platen by preloading the wafer to the platen to achieve significant, preferably uniform, contact pressure across the wafer. Preferably, the means 42 for preloading the wafer 41 applies a preloading force to permit the wafer 41 to accommodate gas pressure across its back side in the range of 5 Torr to 100 Torr without lifting or bowing of the wafer. Typically, this is on the order of 30–50 Torr but may be lower or higher. The upper limit of such preloading would be the pressure at which some wafers would fracture. From external visual inspection one would observe the wafer to be closely clamped into the platen. However, on a microscopic level the area in contact is still significantly less than ten percent (10%) of the total area available. This is the case whether the platen has a metallic or resilient polymeric surface. Into these microscopic voids gas is introduced under pressure. The pressure may be increased up to the level of the preloading since the pressure of the gas in the voids substitutes for the lifting force provided by the peaks on the surface of the platen. Essentially gas pressure is increased while the platen-to-wafer gap remains nearly constant, thereby allowing significant gas pressure to be obtained without bowing or lifting the wafer.

Figure 5:
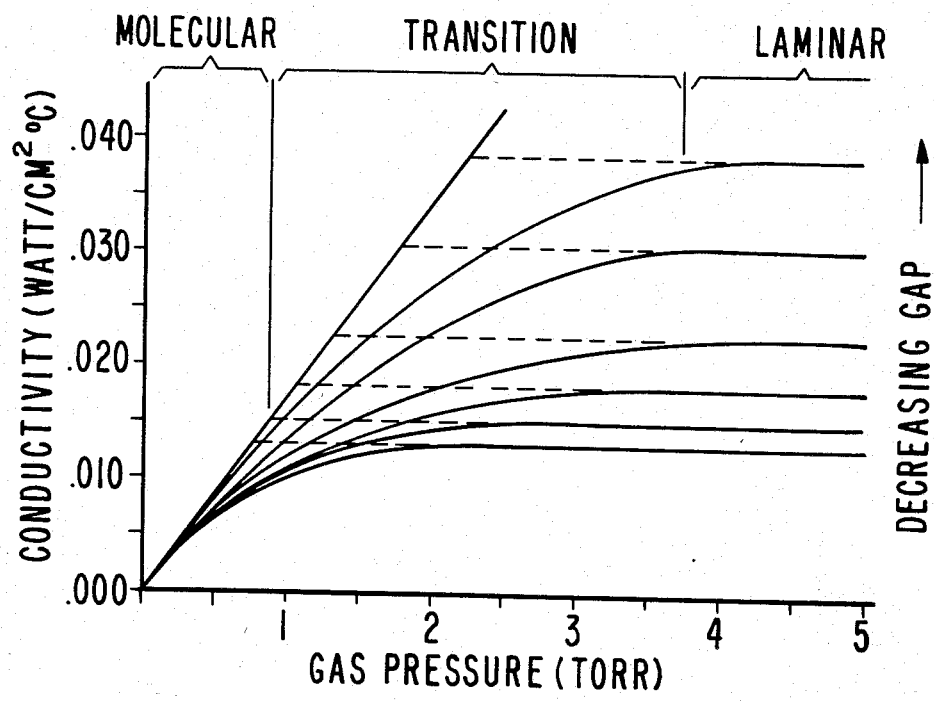
FIG. 5 is a pictorial curve showing thermal transfer in various gas pressure regions.

To fully appreciate the hybrid character of the present invention (solid-to-solid thermal transfer in conjunction with gas conduction), it is useful to examine the mechanism of thermal transfer by gas conduction. As seen in FIG. 5, at low pressures the rate of thermal transfer by gas conduction increases linearly with pressure. Here, the density of the gas increases with increasing pressure and the mean free path remains long enough so that the preponderance of gas collisions take place with either the semiconductor wafer or the platen. Essentially, the gas molecules travel back anf forth between the wafer and the platen. This pressure condition is called molecular flow. In this region, the higher the pressure, the higher the rate of heat transfer between the semiconductor wafer and the platen. For most gases of interest in a semiconductor production environment, the molecular flow region ranges below about 1 Torr. At sufficiently high pressures or at sufficiently large spacings between the semiconductor wafer and the platen, the preponderance of the gas collisions begin to occur between gas molecules rather than with the semiconductor wafer or with the platen. This condition is described as the liminar flow region. Inbetween the molecular flow and laminar flow regions, there is a transitional region where characteristics of both regions are present. The region where some laminar flow characteristics are present lies above about 5 Torr for most gases of interest in the semiconductor production environment. In this region the gas begins to behave at least in part like a fluid where thermal conductivity is independent of pressure. Thus, once this condition is achieved, no benefit is obtained by increasing the pressure for a given gap. Thermal resistance is reduced only by reducing the gap between the semiconductor wafer and the platen. The transition from molecular to laminar flow is gradual and will occur at different points depending upon the platen-to-wafer gap in the system.

Figure 7:
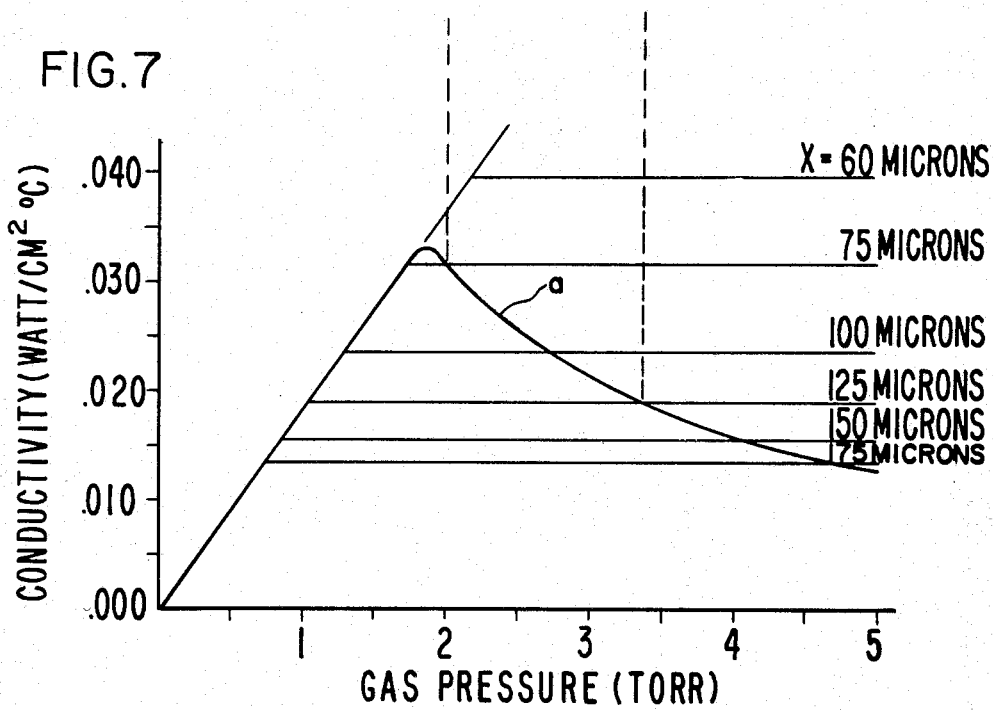
FIG. 7 is a curve showing the thermal transfer capacity of nitrogen gas as a function of gas pressure for a typical semiconductor wafer which is allowed to deflect under the influence of gas pressure.
Figure 9:
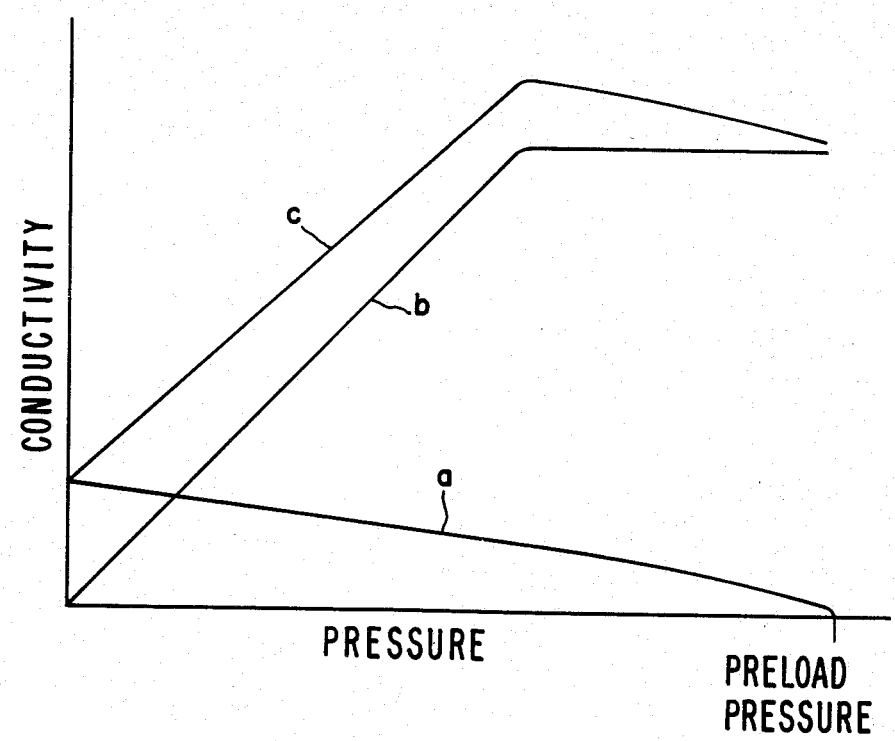
FIG. 9 is a curve showing the contributions to net thermal conduction with a semiconductor wafer made by the solid-to-solid thermal transfer component and the gas conduction component.

In the laminar flow region the resistance to thermal conductivity is pressure independent and gap dependent. This dependence is seen in FIG. 7. The laminar flow region or the transitional region with components of laminar flow produces the horizontal curves where thermal transfer capacity is independent of pressure. Here, the transitional region (see FIG. 5) is folded into the pure laminar flow region. When the transitional or pure laminar flow regions are reached, the thermal transfer capacity becomes constant for a given spacing between the semiconductor wafer and platen. This relationship is well established in the thermal transfer field. See, e.g., H. Grober, et. al., *Fundamentals of Heat Transfer,* Chapter 7, 'Conduction in Rarefied Gases', p. 150 et. seq. (1961) and S. Dushman, *Scientific Foundations of Vacuum Technique,* 2nd Ed., p. 43 (1962). The apparatus and method of the present invention operates in this pressure condition where the laminar flow is present. To obtain operation under this condition, the semiconductor wafer is loaded at its periphery with a peripheral clamping force as shown schematically in FIG. 3. This clamping is similar to the prior art clamping fixture 10 of FIG. 1 but serves an additional purpose. In the prior art, wafer 13 is held against a convexly curved platen by peripheral clamping ring 36 in order to obtain good solid-to-solid contact over the area of the wafer. With the present invention solid-to-solid contact is obtained and in addition, the loading produces a narrow platen-to-wafer gap on the average so that the assistance from gas conduction is optimized. Thus, the solid-to-solid thermal transfer component is present as well as the gas-assisted component. The combination of these components is shown in FIG. 9 where curve 'a' gives the conduction component due to platen-to-wafer contact, curve 'b' gives the contribution due to gas conduction and curve 'c' gives the net conduction. As the pressure is increased up to the preload pressure, the solid contact component is reduced until the wafer lifts off or loses contact with the wafer. The gas conduction component, curve 'b', increases with pressure until the pure laminar flow region is reached and then is essentially constant with pressure.

With the apparatus of the present invention, it has been found that preloading contact pressures of 35 Torr or higher are readily achievable so that corresponding gas pressures may be obtained while retaining the narrow gap. These pressures are easily high enough to establish some laminar flow characteristics (see FIG. 5). At the same time that loading permits sufficiently high gas pressures, the loading minimizes the spacing between the semiconductor wafer and the platen, thereby heightening the thermal transfer capacity of the gas within the microscopic voids between the platen and the semiconductor wafer. Generally, the platen has a convex shape. It preferably has a smoothly finished metal surface, e.g., of soft aluminum. It has been found that such a solid metal source produces the preferred solid-to-solid thermal contact, i.e. produces better than a resilient polymer coating. The quality of the thermal contact is directly proportional to the conductivity of the metal, inversely proportional to the hardness and is proportional to the frequency of the peaks which rise above the asperities in the surface. See the discussion in M. G. Cooper, et. al., "Thermal Contact Conductance", Int. J. Heat Mass Transfer, v. 12, p. 279 (1969). Pliable, thermally conductive polymers may be used, but generally do not possess as high a Figure of Merit. In a preferred embodiment, the curvature of the platen is selected to produce a uniform contact pressure across the wafer when the wafer is preloaded. This preferred curvature is described in the copending application of S. Holden, "Optimum Surface Contour for Conductive Heat Transfer From a Thin Flexible Workpiece", Ser. No. 381,668 filed on even date, and now abandoned.

The operation of the apparatus of the present invention as contrasted to the pure gas conduction thermal transfer of the prior art may be seen by reference to FIG. 8. The conventional gas conduction cooling apparatus of the prior art shown in FIG. 2, has a finite gap 21 between wafer 20 and support plate 23. Since there is no preloading to a shaped platen, at a few Torr the wafer begins to deform thereby increasing the gap. The thermal conductivity drops off sharply as shown by curve 'b'. In contrast, the thermal conductivity for the apparatus of the present invention rises as shown in curve 'a' until the laminar flow region is reached. When the preload pressure of 35 Torr is exceeded the wafer begins to deform and here, too, thermal conductivity drops off sharply as shown in curve 'c'.

The performance achievable by the method of the present invention was demonstrated by implanting a 3-inch photoresist coated silicon wafer with a 2 mA As+ ion beam at 180 KeV. The silicon wafer was clamped to the apparatus of the present invention. Air was introduced between the platen and the wafer at a pressure of less than 30 Torr. A surface area of 51 cm$^2$ was implanted. The incident power density was more than 6 watts/cmhu 2. No deterioration of the photoresist was observed over the entire surface of the wafer.

What is claimed is:

1. A method for thermal transfer with a thin flexible workpiece in vacuum, comprising the steps of:
   providing a platen having a nonplanar surface for receiving said workpiece and forming a solid-to-solid contact with the back side of said workpiece;
   clamping said workpiece at its periphery against said planten surface to produce a platen-to-workpiece preloading contact pressure; and
   introducing a gas into microscopic voids between said workpiece and said platen surface at a predetermined pressure above the level sufficient to cause bowing and reduced thermal transfer with a workpiece which is not preloaded, said predetermined gas pressure being less than said preloading contact pressure.

2. The method as defined in claim 1 further including the step of providing said nonplanar surface of said platen with a convexly curved contour.

3. The method as defined in claim 1 wherein said workpiece is a disk and further including the step of providing said platen surface with an open channel having a radius less than said disk and coupling said channel to a gas source.

4. The method as defined in claim 3 further including the step of providing sealing means radially outward of said channel to prevent escape of said gas.

5. The method as defined in claim 1 wherein said step of clamping said workpiece applies a preloading force to permit said workpiece to accommodate gas pressure across its back side in the range of 5 Torr to 100 Torr without lifting or bowing of the workpiece.

6. A method for thermal transfer with a semiconductor wafer in a vacuum processing chamber, comprising:
   providing a platen having a nonplanar surface for receiving said wafer and forming a solid-to-solid contact with the back side of said wafer;
   loading said wafer at its periphery against said platen surface so as to produce a platen-to-wafer preloading contact pressure over the surface area of said wafer sufficient to maintain solid-to-solid contact between said wafer and said platen when gas is introduced into the microscopic voids between the platen and the wafer; and
   introducing a gas into said microscopic voids between said platen and said wafer at a pressure less than said preloading contact pressure, said step of loading said wafer applying a preloading force to permit said wafer to accommodate gas pressure across its back side in the range of 5 Torr to 100 Torr without lifting or bowing of the wafer.

7. A method for effecting thermal transfer between a semiconductor wafer and a platen, comprising:
   providing a platen having a convexly shaped contour;
   forcing the periphery of said wafer against said platen to produce a platen-to-wafer contact pressure over the surface area of said wafer sufficient to maintain solid-to-solid contact between said wafer and said platen when gas is introduced into the microscopic voids therebetween; and
   introducing gas under pressure into said microscopic voids between saId platen and said semiconductor wafer at a pressure less than said contact pressure but above the pressure sufficient to cause bowing and reduced thermal transfer with a wafer which is not preloaded.

8. A method for effecting thermal transfer in accordance with claim 7 wherein said step of introducing said gas to said microscopic void region is accomplished by the step of flowing said gas through a channel in said platen to the surface of said platen.

9. A method for effecting thermal transfer in accordance with claim 8 wherein said step of flowing said gas through a channel in said platen to the surface of said platen is accomplished by the step of flowing said gas through a channel in said platen to an annular opening in the surface of said platen, said annular opening having a radius slightly less than the radius of said wafer.

* * * * *